United States Patent
Lv

(10) Patent No.: US 7,492,583 B2
(45) Date of Patent: Feb. 17, 2009

(54) PORTABLE COMPUTER HAVING MAGNETIC SWITCH

(75) Inventor: Teng Lv, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/941,976

(22) Filed: Nov. 19, 2007

(65) Prior Publication Data

US 2009/0009952 A1    Jan. 8, 2009

(30) Foreign Application Priority Data

Jul. 2, 2007    (CN) .......................... 2007 1 0200982

(51) Int. Cl.
*G06F 1/16* (2006.01)
(52) U.S. Cl. ........................ 361/683; 438/487; 345/173; 600/301
(58) Field of Classification Search ................ 600/300, 600/301; 438/166, 487, 82; 345/102, 173, 345/520; 713/300, 323; 455/466; 348/152; 361/679–687, 724–727
See application file for complete search history.

(56) References Cited

U.S. PATENT DOCUMENTS

| 4,339,638 A | 7/1982 | Lascelles et al. |
| 2004/0042173 A1* | 3/2004 | Tomioka ..................... 361/687 |
| 2005/0140280 A1* | 6/2005 | Yamazaki et al. .......... 313/504 |

* cited by examiner

*Primary Examiner*—Hung V Duong
(74) *Attorney, Agent, or Firm*—Frank R. Niranjan

(57) ABSTRACT

A portable computer having a display part and a main part includes a magnetic piece installed in the display part, a Hall sensor installed in the main part, a switch circuit, and a control terminal connected to a power supply of a back light module of the display part. The Hall sensor includes a power pin connected to a first DC power supply, an output pin, and a ground pin connected to ground. The output pin of the Hall sensor is connected to the control terminal and a second DC power supply via the switch circuit, when the display part is in a closed position, the Hall sensor senses the magnetic field of the magnetic piece and outputs a control signal to the switch circuit, the switch circuit receives the control signal and turns off the power supply of the back light module via the control terminal.

10 Claims, 3 Drawing Sheets

PORTABLE COMPUTER HAVING MAGNETIC SWITCH

BACKGROUND

1. Field of the Invention

The present invention relates to portable computers, and particularly to a portable computer which has a magnetic switch configured to turn off a power supply of a back light module of a display thereof.

2. Description of Related Art

FIG. 1 illustrates a portable computer 10 with a conventional mechanical switch. The portable computer 10 includes a display part 12 and a main part 14. The mechanical switch is a button switch 140 disposed at a rear end of the main part 14. When the display part 12 is in a closed position, the button switch 140 is pressed, so that a power supply of a back light module of the display part 12 will be turned off.

However, over time, the button switch 140 can wear out and not consistently turn off the power supply.

What is desired, therefore, is to provide a portable computer which overcomes the above problem.

SUMMARY

An embodiment of a portable computer having a display part and a main part includes a magnetic piece installed in the display part, a Hall sensor installed in the main part, a switch circuit, and a control terminal connected to a power supply of a back light module of the display part. The Hall sensor includes a power pin connected to a first DC power supply, an output pin, and a ground pin connected to ground. The output pin of the Hall sensor is connected to the control terminal and a second DC power supply via the switch circuit, when the display part is in a closed position, the Hall sensor senses the magnetic field of the magnetic piece and outputs a control signal to the switch circuit, the switch circuit receives the control signal and turns off the power supply of the back light module via the control terminal.

Other advantages and novel features of the present invention will become more apparent from the following detailed description of an embodiment when taken in conjunction with the accompanying drawings, in which:

DETAILED DESCRIPTION

Figure 1:
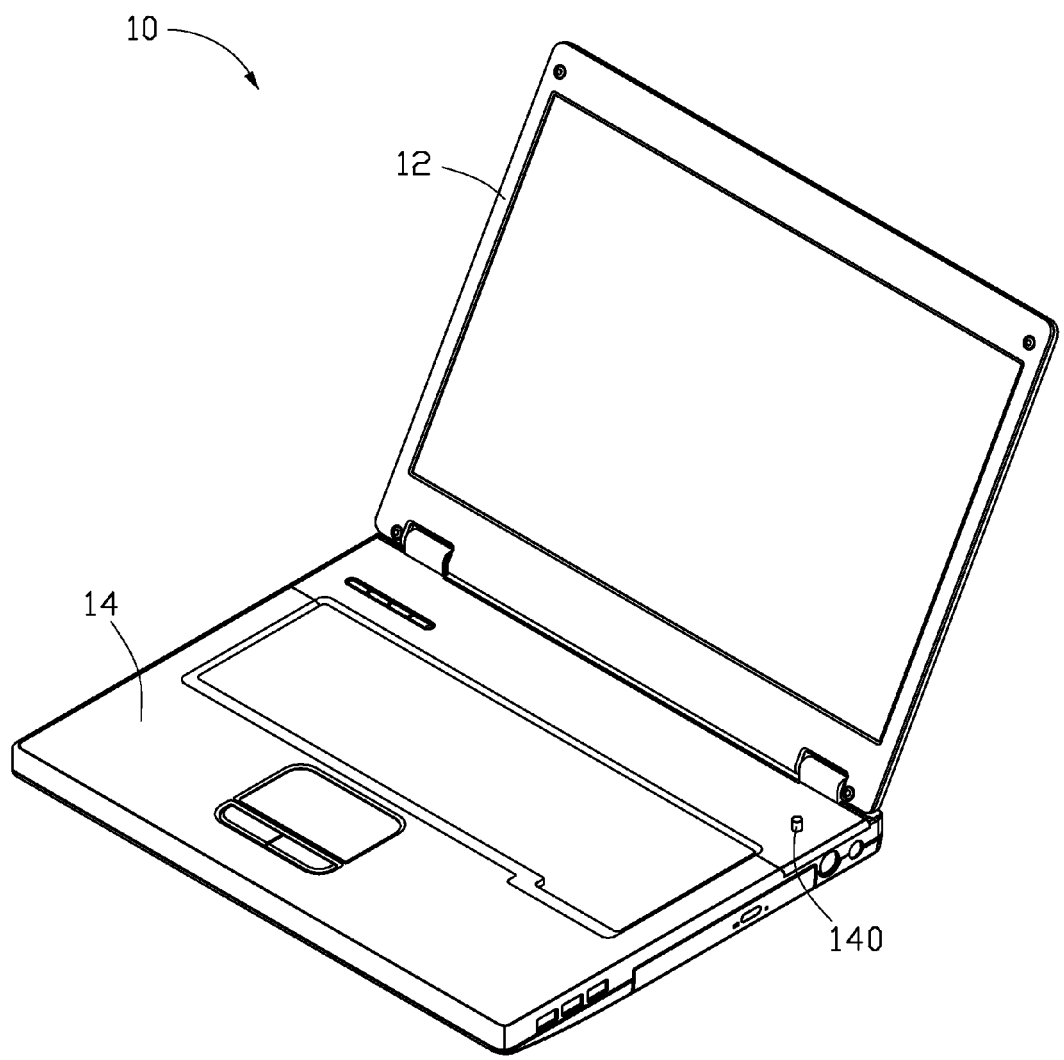
FIG. 1 is an isometric view of a portable computer with a conventional mechanical switch.
Figure 2:
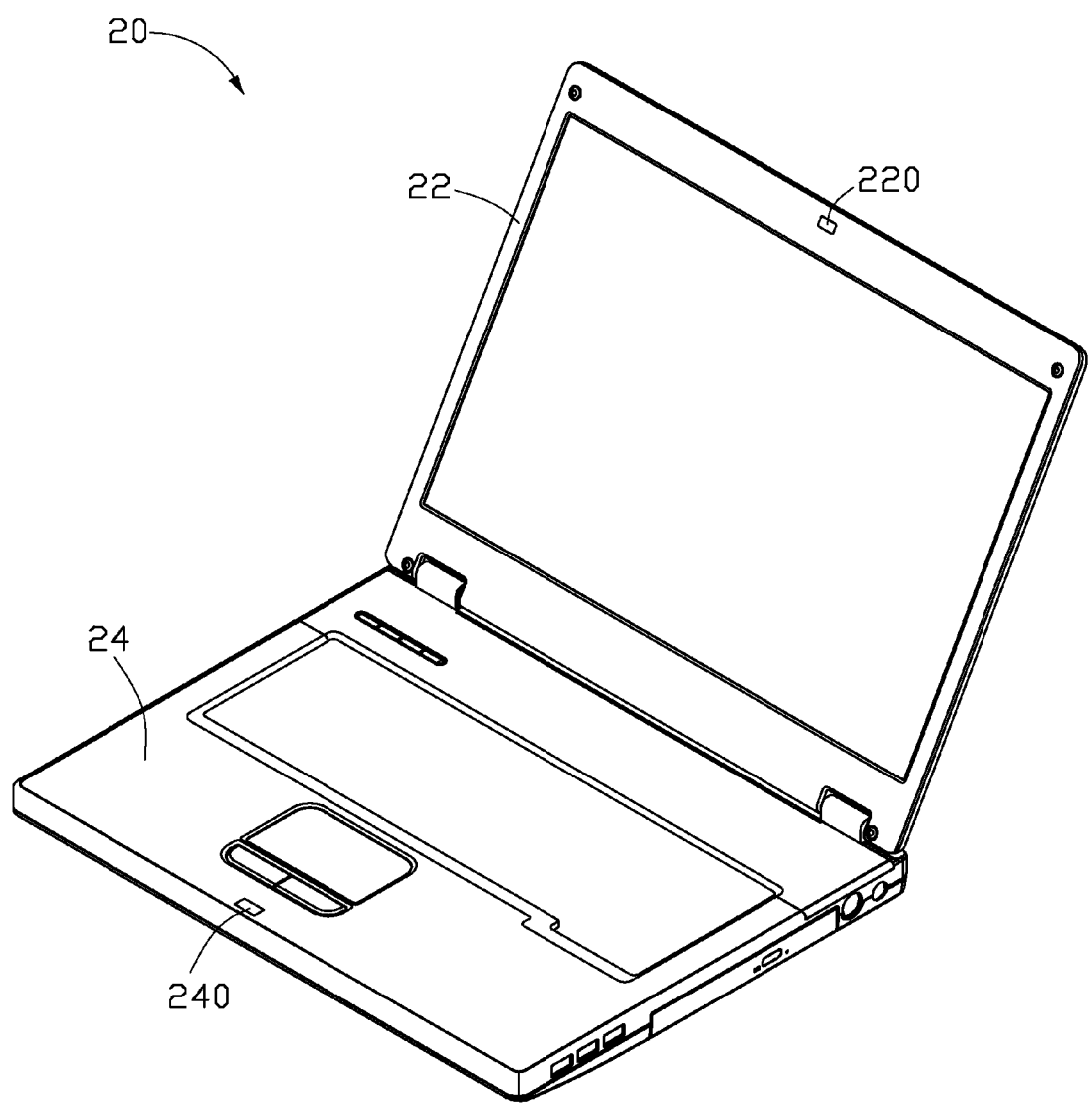
FIG. 2 is an isometric view of a portable computer with a magnetic switch in accordance with an embodiment of the present invention.
Figure 3:
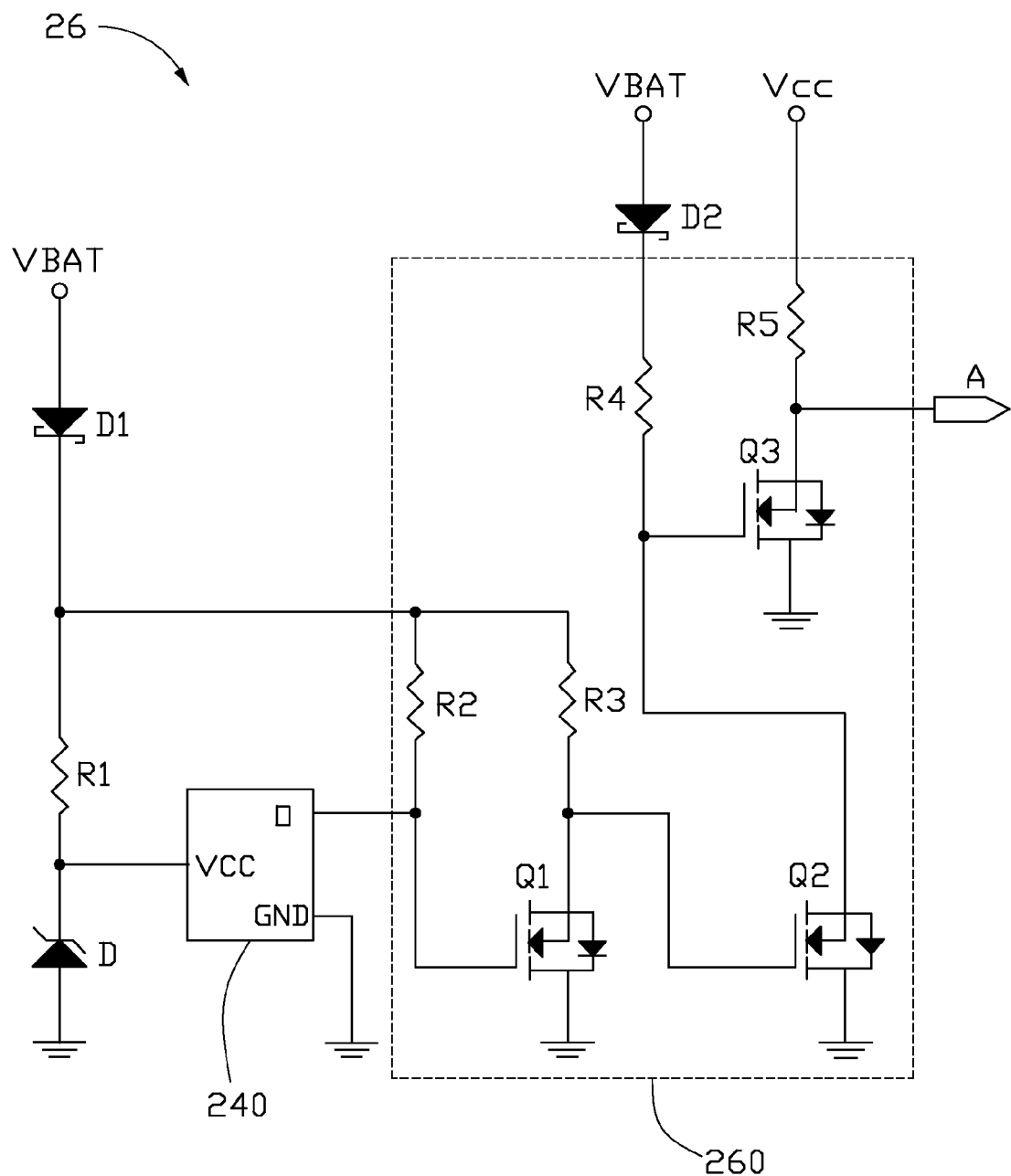
FIG. 3 is a circuit diagram of the magnetic switch of FIG. 2.

Referring to FIGS. 2 and 3, a portable computer 20 with a magnetic switch in accordance with an embodiment of the present invention is shown. The magnetic switch includes a control circuit 26 and a magnetic piece 220 installed in a free end of a display part 22 of the portable computer 20. The control circuit 26 includes a Hall sensor 240 installed in a free end of a main part 24 of the portable computer 20 corresponding to the magnetic piece 220. Alternatively, the magnetic piece 220 may be arranged in the main part 24, and the Hall sensor 240 arranged in the display part 22.

The control circuit 26 further includes a Zener diode D, a first diode D1, a second diode D2, a switch circuit 260, and a control terminal A. The Hall sensor 240 includes an output pin O, a power pin VCC, and a ground pin GND. The switch circuit 260 includes a first transistor Q1, a second transistor Q2, a third transistor Q3, and five resistors R1-R5.

The power pin VCC of the Hall sensor 240 is connected to the anode of the Zener diode D. The cathode of the Zener diode D is grounded. The power pin VCC of the Hall sensor 240 is also connected to the cathode of the first diode D1 via the resistor R1. The anode of the first diode D1 is connected to a direct current (DC) power supply VBAT such as a storage battery of the portable computer 20. The ground pin GND of the Hall sensor 240 is grounded. The output pin O is connected to the gate of the first transistor Q1 and connected to the cathode of the first diode D1 via the resistor R2. The drain of the first transistor Q1 is grounded. The source of the first transistor Q1 is connected to the gate of the second transistor Q2 and connected to the cathode of the first diode D1 via the resistor R3. The drain of the second transistor Q2 is grounded. The source of the second transistor Q2 is connected to the gate of the third transistor Q3 and connected to the cathode of the second diode D2 via the resistor R4. The anode of the second diode D2 is connected to the DC power supply VBAT. The drain of the third transistor Q3 is grounded. The source of the third transistor Q3 is connected to another DC power supply Vcc, such as a 3.3V power supply of a motherboard of the portable computer 20, via the resistor R5 and connected to the control terminal A.

The control terminal A is configured to connect to a power supply of a back light module of the display part 22. When the display part 22 is in a closed position, that is, the display part 22 is near the main part 24, the Hall sensor 240 enters and senses the magnetic field of the magnetic piece 220 and outputs a high voltage signal. The high voltage signal turns on the first transistor Q1 so the second transistor Q2 is turned off and then the third transistor Q3 is turned on, thereby the control terminal A outputs a low voltage signal to the power supply cutting power to the back light module of the display part 22.

When the display part 22 is in an opened position, that is the display part 22 is pivoted away from the main part 24, the Hall sensor 240 leaves the magnetic field of the magnetic piece and can no longer sense the magnetic field of the magnetic piece 220. The Hall sensor 240 then outputs a low voltage signal. The low voltage signal turns off the first transistor Q1 so that the second transistor Q2 is turned on and then the third transistor Q3 is turned off, thereby the control terminal A outputs a high voltage signal to the power supply of the back light module of the display part 22 which provides power to the back light module of the display part 22.

Because the portable computer 20 uses the magnetic switch without moving parts, wear and tear is avoided thereby increasing lifespan of the portable computer 20.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A portable computer having a display part and a main part, the display part having a back light module, the portable computer comprising:

a magnetic piece installed in the display part of the portable computer; and a control circuit installed in the portable computer, the control circuit comprising:

a Hall sensor installed in the main part of the portable computer corresponding to the magnetic piece, the Hall sensor comprising a power pin connected to a first direct current (DC) power supply of the portable computer via a first resistor, an output pin, and a ground pin connected to ground;

a switch circuit; and a control terminal configured for connecting to a power supply of the back light module of the display part, the output pin of the Hall sensor connected to the control terminal and a second DC power supply of the portable computer via the switch circuit, when the display part is in a closed position, the Hall sensor entering and sensing the magnetic field of the magnetic piece and outputting a control signal to the switch circuit, the switch circuit receiving the control signal to turn off the power supply of the back light module of the display part via the control terminal.

2. The portable computer as claimed in claim 1, wherein the switch circuit comprises a first transistor, a second transistor, and a third transistor, the output pin of the Hall sensor is connected to the gate of the first transistor and connected to the first DC power supply via a second resistor, the drain of the first transistor is grounded, the source of the first transistor is connected to the gate of the second transistor and connected to the first DC power supply via a third resistor, the drain of the second transistor is grounded, the source of the second transistor is connected to the gate of the third transistor and connected to the first DC power supply via a fourth resistor, the drain of the third transistor is grounded, the source of the third transistor is connected to the second DC power supply via a fifth resistor and connected to the control terminal.

3. The portable computer as claimed in claim 2, wherein the control circuit further comprises a Zener diode, the power pin of the Hall sensor is connected to the anode of the Zener diode, the cathode of the Zener diode is grounded.

4. The portable computer as claimed in claim 2, wherein the control circuit further comprises a first diode reversely connected between the first resistor and the first DC power supply.

5. The portable computer as claimed in claim 2, wherein the control circuit further comprises a second diode reversely connected between the fourth resistor and the first DC power supply.

6. A magnetic switch configured for an electronic device having a light module and two parts, which can be closed together, the magnetic switch comprising:

a magnetic piece configured for installing in one part of the electronic device;

a Hall sensor configured for installing in the other part of the electronic device corresponding to the magnetic piece, the Hall sensor comprising a power pin connected to a first direct current (DC) power supply via a first resistor, an output pin, and a ground pin connected to ground;

a switch circuit; and a control terminal configured for connecting to a power supply of the light module of the electronic device, the output pin of the Hall sensor connected to the control terminal and a second DC power supply via the switch circuit, when the two parts of the electronic device is in a closed position, the Hall sensor entering and sensing the magnetic field of the magnetic piece and outputting a control signal to the switch circuit, the switch circuit receiving the control signal to turn off the power supply of the light module of the electronic device via the control terminal.

7. The magnetic switch as claimed in claim 6, wherein the switch circuit comprises a first transistor, a second transistor, and a third transistor, the output pin of the Hall sensor is connected to the gate of the first transistor and connected to the first DC power supply via a second resistor, the drain of the first transistor is grounded, the source of the first transistor is connected to the gate of the second transistor and connected to the first DC power supply via a third resistor, the drain of the second transistor is grounded, the source of the second transistor is connected to the gate of the third transistor and connected to the first DC power supply via a fourth resistor, the drain of the third transistor is grounded, the source of the third transistor is connected to the second DC power supply via a fifth resistor and connected to the control terminal.

8. The magnetic switch as claimed in claim 7, wherein the control circuit further comprises a Zener diode, the power pin of the Hall sensor is connected to the anode of the Zener diode, the cathode of the Zener diode is grounded.

9. The magnetic switch as claimed in claim 7, wherein the control circuit further comprises a first diode reversely connected between the first resistor and the first DC power supply.

10. The magnetic switch as claimed in claim 7, wherein the control circuit further comprises a second diode reversely connected between the fourth resistor and the first DC power supply.

* * * * *